(12) United States Patent
Li

(10) Patent No.: US 10,860,420 B2
(45) Date of Patent: Dec. 8, 2020

(54) METHOD AND SYSTEM FOR MITIGATING READ DISTURB IMPACT ON PERSISTENT MEMORY

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 57 days.

(21) Appl. No.: 16/268,401

(22) Filed: Feb. 5, 2019

(65) Prior Publication Data

US 2020/0250031 A1 Aug. 6, 2020

(51) Int. Cl.
| G06F 11/10 | (2006.01) |
| G11C 29/52 | (2006.01) |
| G11C 7/02 | (2006.01) |
| H03M 13/29 | (2006.01) |
| H03M 13/15 | (2006.01) |

(52) U.S. Cl.
CPC .......... *G06F 11/1068* (2013.01); *G11C 7/02* (2013.01); *G11C 29/52* (2013.01); *H03M 13/154* (2013.01); *H03M 13/2906* (2013.01)

(58) Field of Classification Search
CPC ....... G06F 11/1068; G11C 7/02; G11C 29/52; H03M 13/154; H03M 13/2906
See application file for complete search history.

(56) References Cited

U.S. PATENT DOCUMENTS

| 3,893,071 A | * | 7/1975 | Bossen | G06F 11/1028 714/765 |
| 4,718,067 A | * | 1/1988 | Peters | H04N 5/945 714/747 |
| 5,732,093 A | * | 3/1998 | Huang | G11B 20/1813 714/765 |

(Continued)

FOREIGN PATENT DOCUMENTS

WO 9418634 8/1994

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

(Continued)

*Primary Examiner* — Guy J Lamarre
(74) *Attorney, Agent, or Firm* — Shun Yao; Park, Vaughan, Fleming & Dowler LLP

(57) ABSTRACT

One embodiment facilitates data placement in a storage device. During operation, the system receives chunks of data to be written to a non-volatile memory. The system encodes a first chunk based on a first error-correcting code (ECC) to obtain a first ECC-encoded codeword. The system encodes a first group of ECC-encoded codewords which include the first ECC-encoded codeword, based on an erasure code (EC) to obtain a first EC-encoded group, wherein a respective EC-encoded group includes EC parity bits. The system encodes the EC parity bits of the obtained first EC-encoded group based on a second error-correcting code (ECC) to obtain ECC-encoded EC parity bits. The system writes the first EC-encoded group and the ECC-encoded EC parity bits to the non-volatile memory.

20 Claims, 12 Drawing Sheets

(56) References Cited

U.S. PATENT DOCUMENTS

| | | | |
|---|---|---|---|
| 6,148,377 A | 11/2000 | Carter | |
| 8,751,763 B1 | 6/2014 | Ramarao | |
| 8,825,937 B2 | 9/2014 | Atkisson | |
| 9,043,545 B2 | 5/2015 | Kimmel | |
| 9,088,300 B1 | 7/2015 | Chen | |
| 9,280,472 B1 | 3/2016 | Dang | |
| 9,280,487 B2 | 3/2016 | Candelaria | |
| 9,529,601 B1 | 12/2016 | Dharmadhikari | |
| 9,588,698 B1 | 3/2017 | Karamcheti | |
| 9,588,977 B1 | 3/2017 | Wang | |
| 10,013,169 B2 | 7/2018 | Fisher | |
| 10,235,198 B2 | 3/2019 | Qiu | |
| 2002/0073358 A1 | 6/2002 | Atkinson | |
| 2003/0145274 A1* | 7/2003 | Hwang | G11B 20/1833 714/799 |
| 2003/0163594 A1 | 8/2003 | Aasheim | |
| 2003/0163633 A1 | 8/2003 | Aasheim | |
| 2005/0195635 A1 | 9/2005 | Conley | |
| 2005/0235067 A1 | 10/2005 | Creta | |
| 2007/0101096 A1 | 5/2007 | Gorobets | |
| 2008/0034154 A1 | 2/2008 | Lee | |
| 2009/0113219 A1 | 4/2009 | Aharonov | |
| 2009/0307249 A1 | 12/2009 | Koifman | |
| 2009/0310412 A1 | 12/2009 | Jang | |
| 2010/0169470 A1 | 7/2010 | Takashige | |
| 2011/0055471 A1 | 3/2011 | Thatcher | |
| 2011/0099418 A1 | 4/2011 | Chen | |
| 2011/0161784 A1 | 6/2011 | Selinger | |
| 2011/0218969 A1 | 9/2011 | Anglin | |
| 2011/0258514 A1* | 10/2011 | Lasser | H03M 13/2906 714/763 |
| 2012/0084523 A1 | 4/2012 | Littlefield | |
| 2012/0096330 A1* | 4/2012 | Przybylski | H03M 13/036 714/763 |
| 2012/0147021 A1 | 6/2012 | Cheng | |
| 2012/0159289 A1 | 6/2012 | Piccirillo | |
| 2012/0210095 A1 | 8/2012 | Nellans | |
| 2012/0278579 A1 | 11/2012 | Goss | |
| 2012/0284587 A1 | 11/2012 | Yu | |
| 2013/0061029 A1 | 3/2013 | Huff | |
| 2013/0080391 A1 | 3/2013 | Raichstein | |
| 2013/0151759 A1 | 6/2013 | Shim | |
| 2013/0219131 A1 | 8/2013 | Alexandron | |
| 2013/0238955 A1* | 9/2013 | D'Abreu | G11C 29/04 714/763 |
| 2014/0082273 A1 | 3/2014 | Segev | |
| 2014/0108414 A1 | 4/2014 | Stillerman | |
| 2014/0181532 A1 | 6/2014 | Camp | |
| 2014/0304452 A1 | 10/2014 | De La Iglesia | |
| 2015/0019798 A1 | 1/2015 | Huang | |
| 2015/0106559 A1 | 4/2015 | Cho | |
| 2015/0227316 A1 | 8/2015 | Warfield | |
| 2015/0277937 A1 | 10/2015 | Swanson | |
| 2015/0301964 A1 | 10/2015 | Brinicombe | |
| 2015/0304108 A1 | 10/2015 | Obukhov | |
| 2015/0363271 A1 | 12/2015 | Haustein | |
| 2016/0014039 A1 | 1/2016 | Reddy | |
| 2016/0274636 A1 | 9/2016 | Kim | |
| 2016/0306853 A1 | 10/2016 | Sabaa | |
| 2017/0075583 A1 | 3/2017 | Alexander | |
| 2017/0075594 A1 | 3/2017 | Badam | |
| 2017/0109232 A1 | 4/2017 | Cha | |
| 2017/0147499 A1 | 5/2017 | Mohan | |
| 2017/0162235 A1 | 6/2017 | De | |
| 2017/0177259 A1* | 6/2017 | Motwani | H03M 13/2906 |
| 2017/0212708 A1 | 7/2017 | Suhas | |
| 2017/0228157 A1 | 8/2017 | Yang | |
| 2017/0249162 A1 | 8/2017 | Tsirkin | |
| 2017/0262178 A1 | 9/2017 | Hashimoto | |
| 2017/0285976 A1 | 10/2017 | Durham | |
| 2017/0286311 A1 | 10/2017 | Juenemann | |
| 2017/0344470 A1 | 11/2017 | Yang | |
| 2017/0344491 A1 | 11/2017 | Pandurangan | |
| 2018/0033491 A1* | 2/2018 | Marelli | G06F 11/076 |
| 2018/0107591 A1 | 4/2018 | Smith | |
| 2018/0143780 A1 | 5/2018 | Cho | |
| 2018/0167268 A1 | 6/2018 | Liguori | |
| 2018/0189182 A1 | 7/2018 | Wang | |
| 2018/0270110 A1 | 9/2018 | Chugtu | |
| 2018/0329776 A1 | 11/2018 | Lai | |
| 2018/0373428 A1 | 12/2018 | Kan | |
| 2019/0012111 A1 | 1/2019 | Li | |
| 2019/0073262 A1 | 3/2019 | Chen | |
| 2019/0205206 A1 | 7/2019 | Hornung | |

OTHER PUBLICATIONS

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< Fast '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

* cited by examiner

METHOD AND SYSTEM FOR MITIGATING READ DISTURB IMPACT ON PERSISTENT MEMORY

BACKGROUND

Field

This disclosure is generally related to the field of data storage. More specifically, this disclosure is related to a method and system for mitigating read disturb impact on persistent memory.

Related Art

The proliferation of the Internet and e-commerce continues to create a vast amount of digital content. Various storage systems have been created to access and store such digital content. A storage system or server can include various types of physical media for storage of data, including volatile memory (which needs constant power in order to retain stored data) and non-volatile memory (which can retain stored data despite losing power). Some examples of current non-volatile memory media include magnetoresistive RAM (MRAM), resistive RAM (ReRAM), phase change memory (PCM), nano-RAM (NRAM), and ferroelectric RAM (FRAM). The persistent property of non-volatile memory is increasingly important for applications which require a low-latency but frequent access. To serve such applications, a system may intensively (i.e., frequently) read out data from random locations of the non-volatile memory to be held as copies on other physical media, while the original version of the data remains stored in the non-volatile memory. One challenge associated with these frequent read operations is the "read disturb," in which the coupling effect of the memory array can result in data loss. When data is read from one or more cells, the current/voltage applied onto the targeted cell(s) can generate coupling effects on the neighboring cells. The accumulation of this coupling effect can create a high raw bit error rate, which can result in data modification and/or data loss. Thus, the frequent retrieval/reading out of data from the non-volatile memory may result in a significant level of read disturb.

One solution is to use a strong error-correction code (ECC) which may approach the theoretical bound. A strong ECC encoding can result in long codeword groups which include multiple small chunks together for encoding and decoding. However, because the granularity of memory access is relatively small, when one small chunk is read, many other unused chunks (e.g., on the order of tens or more) are also read. This can result in an increased read amplification, which in turn can exacerbate the read disturb impact, which in turn can increase the burden of the ECC encoding and decoding. Furthermore, the encoding and decoding complexity of the strong ECC can result in an increased latency. These challenges can decrease the efficiency and performance of a storage system.

SUMMARY

One embodiment facilitates data placement in a storage device. During operation, the system receives chunks of data to be written to a non-volatile memory. The system encodes a first chunk based on a first error-correcting code (ECC) to obtain a first ECC-encoded codeword. The system encodes a first group of ECC-encoded codewords which include the first ECC-encoded codeword, based on an erasure code (EC) to obtain a first EC-encoded group, wherein a respective EC-encoded group includes EC parity bits. The system encodes the EC parity bits of the obtained first EC-encoded group based on a second error-correcting code (ECC) to obtain ECC-encoded EC parity bits. The system writes the first EC-encoded group and the ECC-encoded EC parity bits to the non-volatile memory.

In some embodiments, the first error-correcting code provides a first uncorrectable bit error rate, the second error-correcting code provides a second uncorrectable bit error rate, and the first rate is a predetermined amount greater than the second rate.

In some embodiments, a short ECC-encoded codeword includes short ECC parity bits, the ECC-encoded EC parity bits comprise strong ECC parity bits, and a first error rate associated with the encoding to obtain the short ECC parity bits is greater than a second error rate associated with the encoding to obtain the ECC-encoded EC parity bits.

In some embodiments, in response to receiving a request to read the first chunk of data: the system reads the first short ECC-encoded codeword from the non-volatile memory; the system decodes the first short ECC-encoded codeword based on the first error-correcting code; in response to unsuccessfully decoding the first short ECC-encoded codeword based on the first error-correcting code, the system decodes the first EC-encoded group based on the erasure code; in response to unsuccessfully decoding the first EC-encoded group based on the erasure code, the system decodes the ECC-encoded EC parity bits based on the second error-correcting code; and in response to unsuccessfully decoding the ECC-encoded EC parity bits based on the second error-correcting code, the system generates a failure notification for the host.

In some embodiments, in response to successfully decoding the first short ECC-encoded codeword based on the first error-correcting code, the system successfully reads the first chunk of data. In response to successfully decoding the first EC-encoded group based on the erasure code, the system successfully reads the first chunk of data. In response to successfully decoding the ECC-encoded EC parity bits based on the second error-correcting code, the system decodes the first EC-encoded group based on the erasure code.

In some embodiments, writing the first EC-encoded group and the ECC-encoded EC parity bits to the non-volatile memory further comprises: distributing the first EC-encoded group and the ECC-encoded EC parity bits for placement onto a plurality of ranks of physical media of the non-volatile memory.

In some embodiments, the system tracks, by an error statistics module, an error count and an error pattern associated with decoding the first EC-encoded group. In response to detecting a condition to re-map the data stored in the first EC-encoded group, the system determines a new physical address in the non-volatile memory at which to store the first EC-encoded group. The system writes the first EC-encoded group and the ECC-encoded EC parity bits to the non-volatile memory at the new physical address.

In some embodiments, the condition to re-map the data is based on one or more of: a predetermined threshold for the error count or the error pattern; a predetermined time period or interval; an access frequency of the data stored in the first EC-encoded group; a garbage collection process; and a background operation associated with re-mapping data.

In some embodiments, the non-volatile memory is coupled to a central processing unit and includes: an interface for communicating with the central processing unit; a non-volatile memory controller which performs encoding based on the first error-correcting code, the erasure code, and the second error-correcting code; and physical media associated with a plurality of ranks of the non-volatile memory to which data is to be written for persistent storage.

BRIEF DESCRIPTION OF THE FIGURES

In the figures, like reference numerals refer to the same figure elements.

DETAILED DESCRIPTION

Figure 1:
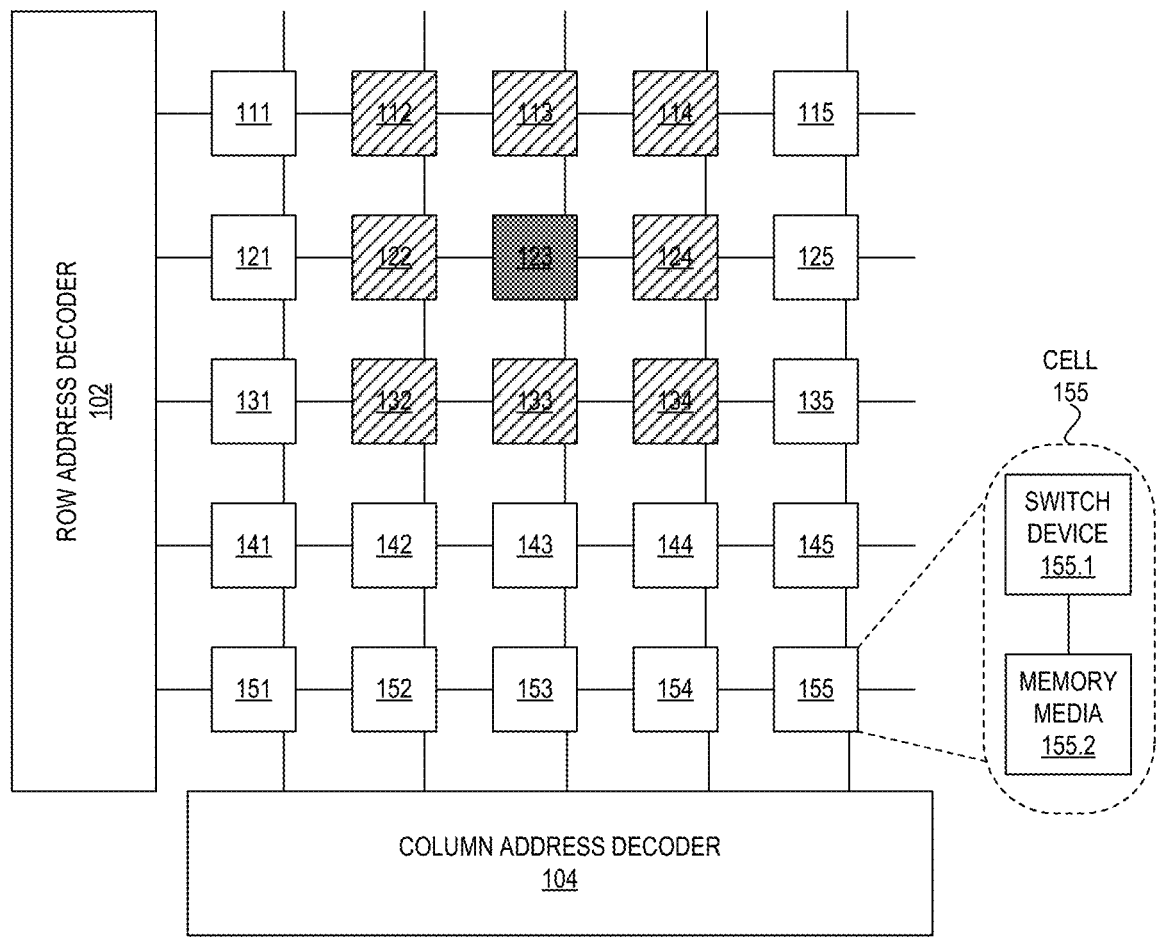
FIG. 1 illustrates an exemplary environment which demonstrates the coupling effect in a memory array, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of mitigating the read disturb impact on persistent memory by providing three levels of encoding: encoding small chunks using a short (e.g., a weak or a medium) error correcting code (ECC); encoding groups of short ECC-encoded chunks using an erasure code (EC); and encoding the EC parity bits of the EC-encoded group using a strong ECC.

As described above, the persistent property of non-volatile memory is increasingly important for applications which require a low-latency but frequent access. To serve such applications, a system may intensively (i.e., frequently) read out data from random locations of the non-volatile memory to be held as copies on other physical media, while the original version of the data remains stored in the non-volatile memory. One challenge associated with these frequent read operations is the "read disturb," in which the coupling effect of the memory array can result in data loss. When data is read from one or more cells, the current/voltage applied onto the targeted cell(s) can generate coupling effects on the neighboring cells. The accumulation of this coupling effect can create a high raw bit error rate, which can result in data modification and/or data loss. Thus, the frequent retrieval/reading out of data from the non-volatile memory may result in a significant level of read disturb, as described below in relation to FIG. 1.

One solution is to use a strong error-correction code (ECC) which may approach the theoretical bound. A strong ECC encoding can result in long codeword groups which include multiple small chunks together for encoding and decoding. However, because the granularity of memory access is relatively small, when one small chunk is read, many other unused chunks (e.g., on the order of tens or more) are also read, as described below in relation to FIG. 2. This can result in an increased read amplification, which in turn can exacerbate the read disturb impact, which in turn can increase the burden of the ECC encoding and decoding. Furthermore, the encoding and decoding complexity of the strong ECC can result in an increased latency. These challenges can decrease the efficiency and performance of a storage system.

The embodiments described herein address these challenges by providing a system which mitigates the read disturb impact on persistent memory by using three levels of encoding. During operation, the system receives chunks of data to be written to a non-volatile memory (persistent memory or "pmem"). The system encodes each chunk based on a short ECC, that is, a weak or a medium ECC which results in a short ECC-encoded codeword. The system accumulates and determines a "group" of short ECC-encoded codewords, and encodes the group based on an erasure code (EC), to obtain an EC-encoded group which includes EC parity bits. The system can write the EC-encoded group to the non-volatile memory, resulting in a reliable and stable EC parity for the EC-encoded group. The system can also encode the EC parity bits based on a strong ECC, to obtain ECC-encoded EC parity bits. This strong ECC protects only the EC parity bits. The system can write the (strong) ECC-encoded EC parity bits to the non-volatile memory, further resulting in a reliable and stable ECC for the EC parity bits of the EC-encoded group. These multiple folds of data protection are described below in relation to FIG. 3.

Subsequently, the system can retrieve the chunks of encoded data (i.e., the short ECC-encoded codewords) from the non-volatile memory. If the system cannot successfully decode a short ECC-encoded codeword based on the short ECC, the system can decode the EC-encoded group based on the erasure code. If the system cannot successfully decode the EC-encoded group based on the erasure code, the system can decode the ECC-encoded EC parity bits based on the strong ECC. The encoding and subsequent retrieval process is described below in relation to FIG. 7.

The strong ECC encoding protects only the EC parity bits, and does not directly protect the group of short ECC-encoded codewords. Thus, upon decoding, the system can directly retrieve the short ECC-encoded codewords, which can mitigate the read disturb impact. Furthermore, by protecting the EC parity bits with the strong ECC encoding, the system can ensure data which is practically error-free. This, coupled with the low probability of needing to read/decode these strong ECC protected EC parity bit, can also mitigate the read disturb impact.

Thus, the embodiments described herein provide a system which improves the efficiency of a storage system, where the improvements are fundamentally technological. The system provides a technological solution (by using three levels of encoding) to the technological problem of mitigating the read disturb impact on persistent memory, which can result in improving the overall efficiency and performance of the system.

The term "physical address" can refer to a physical block address (PBA), a physical page address (PPA), or an address which identifies a physical location on a storage medium or in a storage device.

Impact of Read Disturb in the Prior Art

FIG. 1 illustrates an exemplary environment 100 which demonstrates the coupling effect in a memory array, in accordance with the prior art. Environment 100 can include rows and columns of cells in a memory array. Environment 100 can include: a row address decoder 102; a column address decoder 104; and multiple cells, such as 111-115, 121-125, 131-135, 141-145, and 151-155. A cell can include a switch device and memory media. For example, cell 155 can include a switch device 155.1 and memory media 155.2.

During operation, when data is read from one or more targeted cells, the system can apply current/voltage onto the targeted cell(s). However, as described above, the applied current/voltage can generate coupling effects on the neighboring cells. The accumulation of this coupling effect can create a high raw bit error rate, which can result in data modification and/or data loss. For example, when reading data from "targeted" cell 123 (indicated by the shading of targeted cell 160 in the index), the system can apply a current/voltage which generates coupling effects on neighboring cells 112, 113, 114, 122, 124, 132, 133, and 134 (indicated by the right-slanting diagonal lines of a neighboring cell impacted by coupling effect 162 in the index). This coupling effect, when accumulated over time, can result in a high error rate, data modification, and data loss. Thus, the frequent retrieval/reading out of data from the non-volatile memory may result in a significant level or impact of read disturb.

Figure 2:
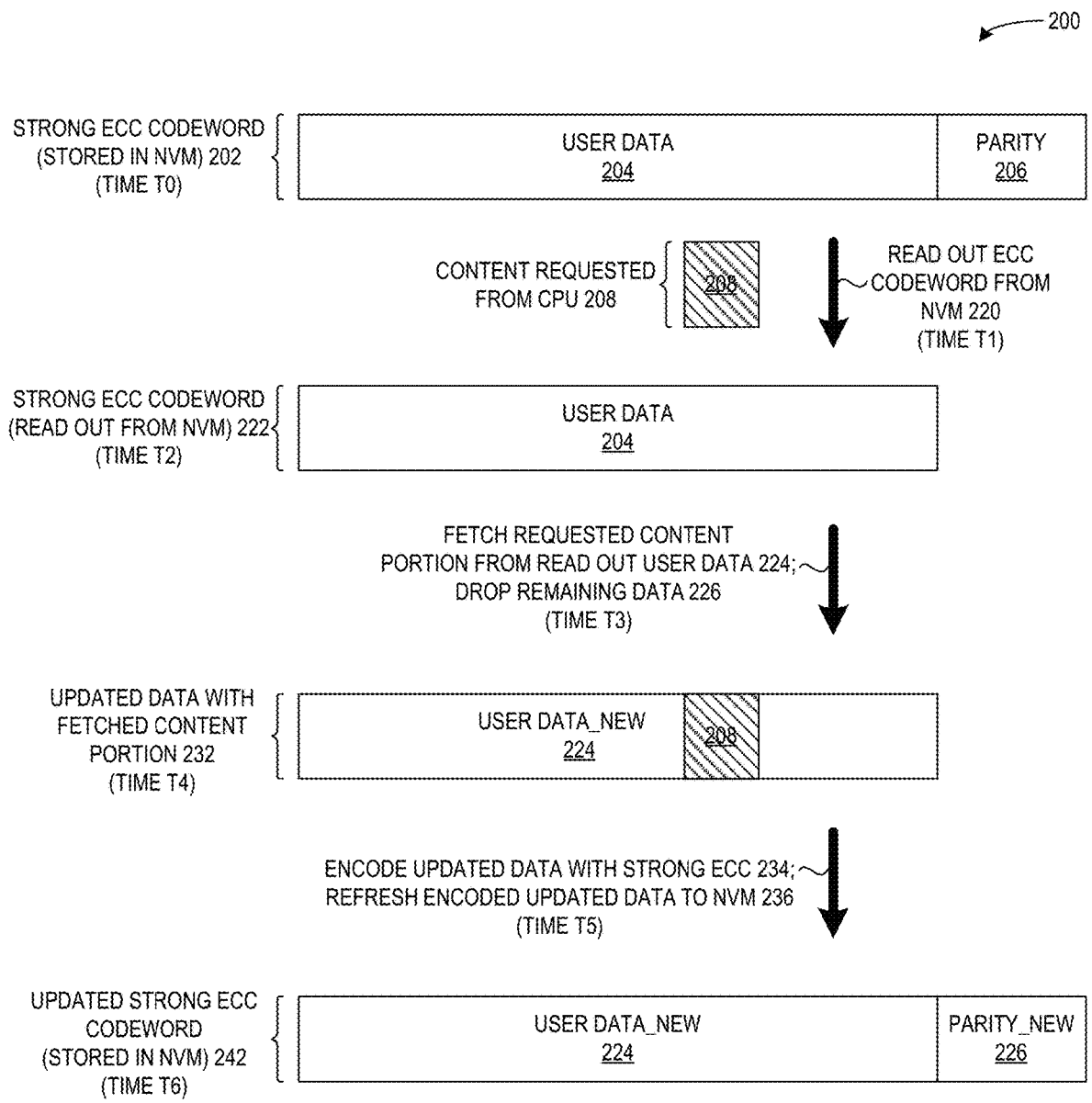
FIG. 2 illustrates an exemplary read disturb impact using a strong ECC-encoding, in accordance with the prior art.

Furthermore, the solution of using a strong error-correction code (ECC) to account for the high bit error rate associated with the impact of the read disturb can result in several inefficiencies and challenges. FIG. 2 illustrates an exemplary read disturb impact 200 using a strong ECC-encoding, in accordance with the prior art. At a time T0, a strong ECC codeword (stored in the non-volatile memory) 202 can include user data 204 and parity 206. The system can receive a request to read a small chunk of content, e.g.,
content requested from CPU 208. At a time T1, the system can read out the ECC codeword from the non-volatile memory (function 220). At a time T2, the resulting strong ECC codeword (read out from the non-volatile memory) 222 can include user data 204. At a time T3, the system can fetch the requested content portion from the read out user data 204 (function 224) and can also drop the remaining data from the user data 204 (function 226).

At a time T4, updated data with fetched content portion 232 can include user data_new 224, which includes the fetched requested content portion from user data 204 (i.e., data 208). Subsequently, at a time T5, the system can encode the updated data with a strong ECC (function 234) (to obtain a new parity, parity_new 226), and can also refresh (e.g., write) the encoded updated data to the non-volatile memory (function 236). Thus, at a time T6, an updated strong ECC code (stored in the non-volatile memory) 242 can include user data_new 224 and parity_new 226.

Thus, impact 200 illustrates how long ECC codewords include multiple small chunks together for encoding and decoding. Because the granularity of memory access is relatively small, when one small chunk is read, many other unused chunks (e.g., on the order of tens more) are also read, which can result in an increased read amplification. This in turn can exacerbate the read disturb impact, which in turn can increase the burden of the ECC encoding and decoding. Furthermore, the encoding and decoding complexity of the strong ECC can result in an increased latency. These challenges can decrease the efficiency and performance of a storage system.

Figure 3:
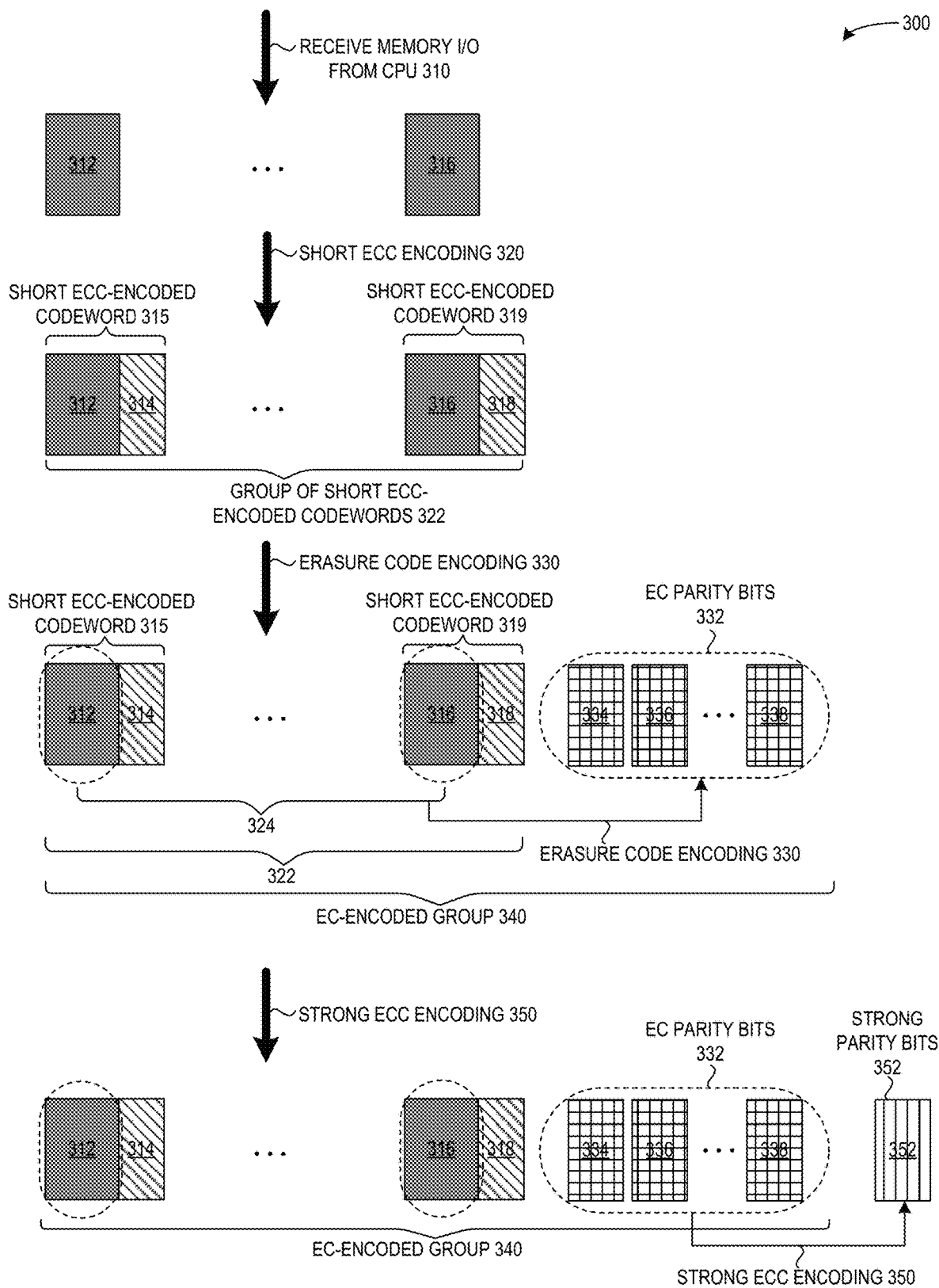
FIG. 3 illustrates an exemplary environment for facilitating data placement, including mitigating the read disturb impact on persistent memory, in accordance with an embodiment of the present application.

Exemplary Environment and Architecture for Facilitating Mitigating the Read Disturb Impact on Persistent Memory FIG. 3 illustrates an exemplary environment 300 for facilitating data placement, including mitigating the read disturb impact on persistent memory, in accordance with an embodiment of the present application. In environment 300, the system can receive memory input/output (I/O) data from CPU (function 310), such as data chunks 312 and 316 (indicated by a shaded box). The system can perform a short ECC encoding (function 320) on each of the data chunks, to obtain, respectively: a short ECC-encoded codeword 315 which includes data 312 and corresponding short ECC-parity bits 314; and a short ECC-encoded codeword 319 which includes data 316 and corresponding short ECC-parity bits 318. The short ECC-encoding can be a weak or a medium ECC-encoding which provides a first uncorrectable bit error rate (UBER) (e.g., $10^{-5}$ or $10^{-6}$).

Multiple short ECC-encoded codewords (including 315 and 319) can comprise a group of short ECC-encoded codewords 322. The system can perform an erasure code (EC) encoding (function 330) on the group of short ECC-encoded codewords 322, to obtain an EC-encoded group 340, which includes: group of short ECC-encoded codewords 322; and EC parity bits 332. Group 322 can also include a group 324, which comprises only the data from each of the short ECC-encoded codewords of group 322, and the EC encoding 330 can be performed on group 324 of group 322. Furthermore, EC parity bits 332 can include EC parity bits 334, 336, and 338, which can correspond to various groups or portions of group 324 or group 322.

Subsequently, the system can perform a strong error-correction code (ECC) encoding (function 350) on EC parity bits 332 of EC-encoded group 340, to obtain strong parity bits 352. The strong ECC-encoding can be a strong ECC-encoding which provides a second uncorrectable bit error rate (UBER) (e.g., $10^{-17}$). The first UBER can be greater than the second UBER, and can also be greater by a predetermined amount than the second UBER.

Thus, in the embodiments described herein, the system can encode data of a small granularity (e.g., data chunks 312 and 316) with a short (e.g., weak or medium) ECC, which results in an ECC codeword of a short length (e.g., short ECC-encoded codeword 315) (a first level of data protection). The system can then provide protection for a group of short ECC-encoded codewords by performing an erasure coding on the group of short ECC-encoded codewords or on the group of data from each short ECC-encoded codeword (a second level of data protection). Finally, the system can then encode the EC parity bits only (obtained from the second level of protection) with a strong ECC (a third level of data protection).

By using these three levels of data protection in the above-described manner, the system can provide read access to data in a secure and efficient manner. That is, the system can retrieve data by first performing the short ECC-decoding on a target short ECC-encoded codeword. If that fails, the system can perform the EC-decoding on the EC-encoded group which includes the target ECC-encoded codeword. Finally, only if both the short ECC-decoding and the EC-decoding fails, the system can perform the strong ECC-decoding on the EC parity bits.

These three levels of data protection (and corresponding levels of decoding upon reading out from the non-volatile memory) can also result in an improved latency. For example, given a UBER of the short ECC-encoding (the first ECC) of $10^{-5}$ (or $10^{-6}$), then only 1 out of 100,000 (or 1 out of 1,000,000) may need EC-decoding after the short ECC-decoding fails. This may result in a certain latency. However, the remaining 99,999 (or 999,999) may experience a shorter latency from the short ECC-decoding, in contrast with the EC-decoding or the further strong ECC-decoding (i.e., the second ECC, which can provide a UBER of, e.g., $10^{-17}$). Thus, the embodiments described herein can result in an improved overall latency for performing and executing I/O operations, which can improve the overall efficiency and performance of the system.

Figure 4:
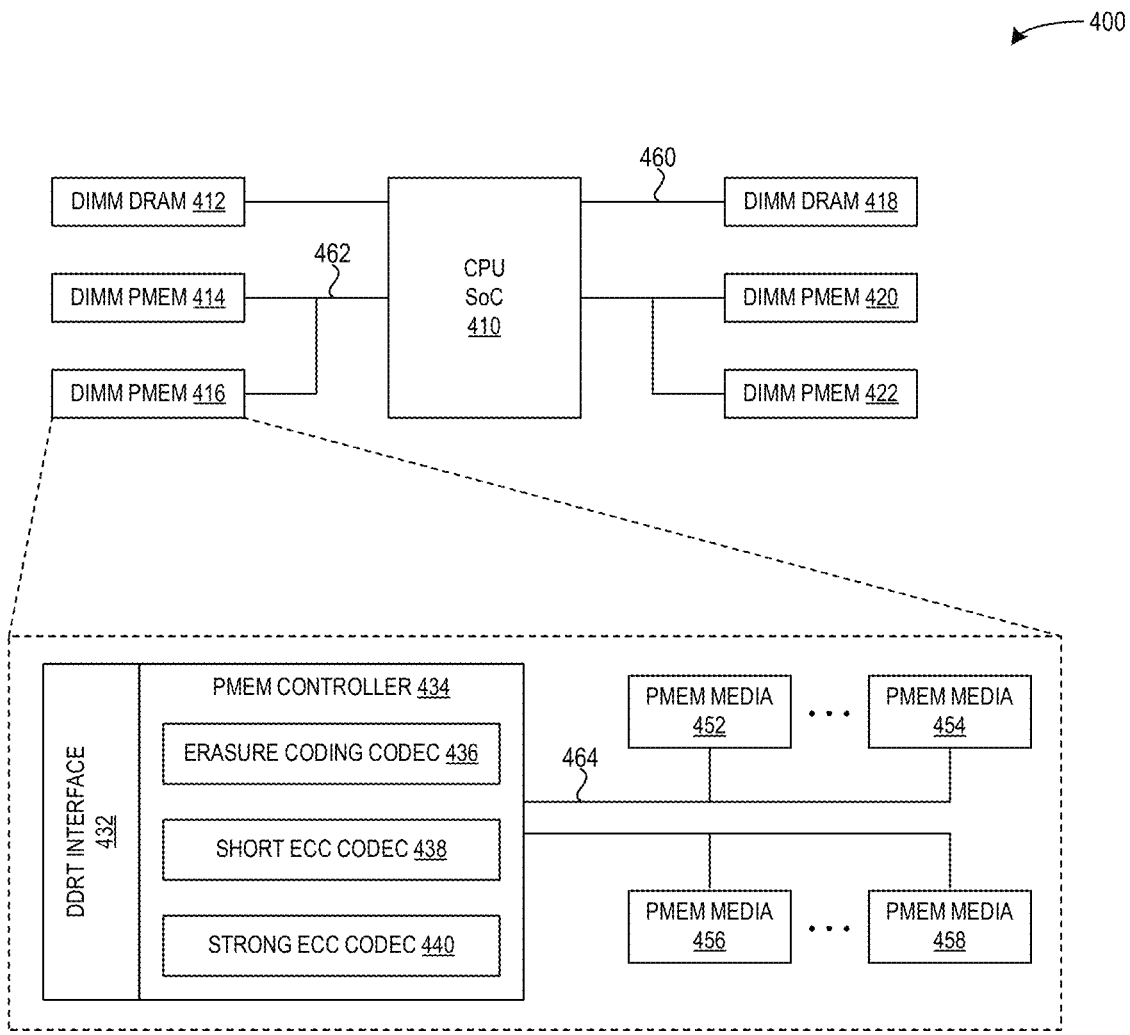
FIG. 4 illustrates an exemplary architecture for facilitating data placement, in accordance with an embodiment of the present application.

FIG. 4 illustrates an exemplary architecture 400 for facilitating data placement, in accordance with an embodiment of the present application. Architecture 400 can include a central processing unit system on a chip (CPU SoC) 410, which is coupled (via 460) to various dual in-line memory modules (DIMMs), such as a DIMM dynamic random access (DRAM) 412 and a DIMM DRAM 418. CPU 410 can also be coupled (via 462) to DIMM persistent memory (PMEM), such as DIMM PMEMs 414, 416, 420, and 422.

A DIMM PMEM can include persistent memory in physical media and can also include its own controller which can perform the three levels of encoding/decoding, i.e., the short ECC-encoding/decoding, the EC encoding/decoding, and the strong ECC-encoding/decoding. For example, DIMM PMEM 416 can include: a DDRT interface 432, which provides an interface between the DIMM and the CPU; a PMEM controller 434, which includes firmware or other instructions for an erasure coding codec 436, a short ECC codec 438, and a strong ECC codec 440; and PMEM media 452, 454, 456, and 458 (accessible via 464). Codecs 436, 438, and 440 can perform, respectively, the encoding/decoding of EC, short ECC, and strong ECC described herein.

Exemplary Environment for Facilitating Data Scrubbing

Figure 5:
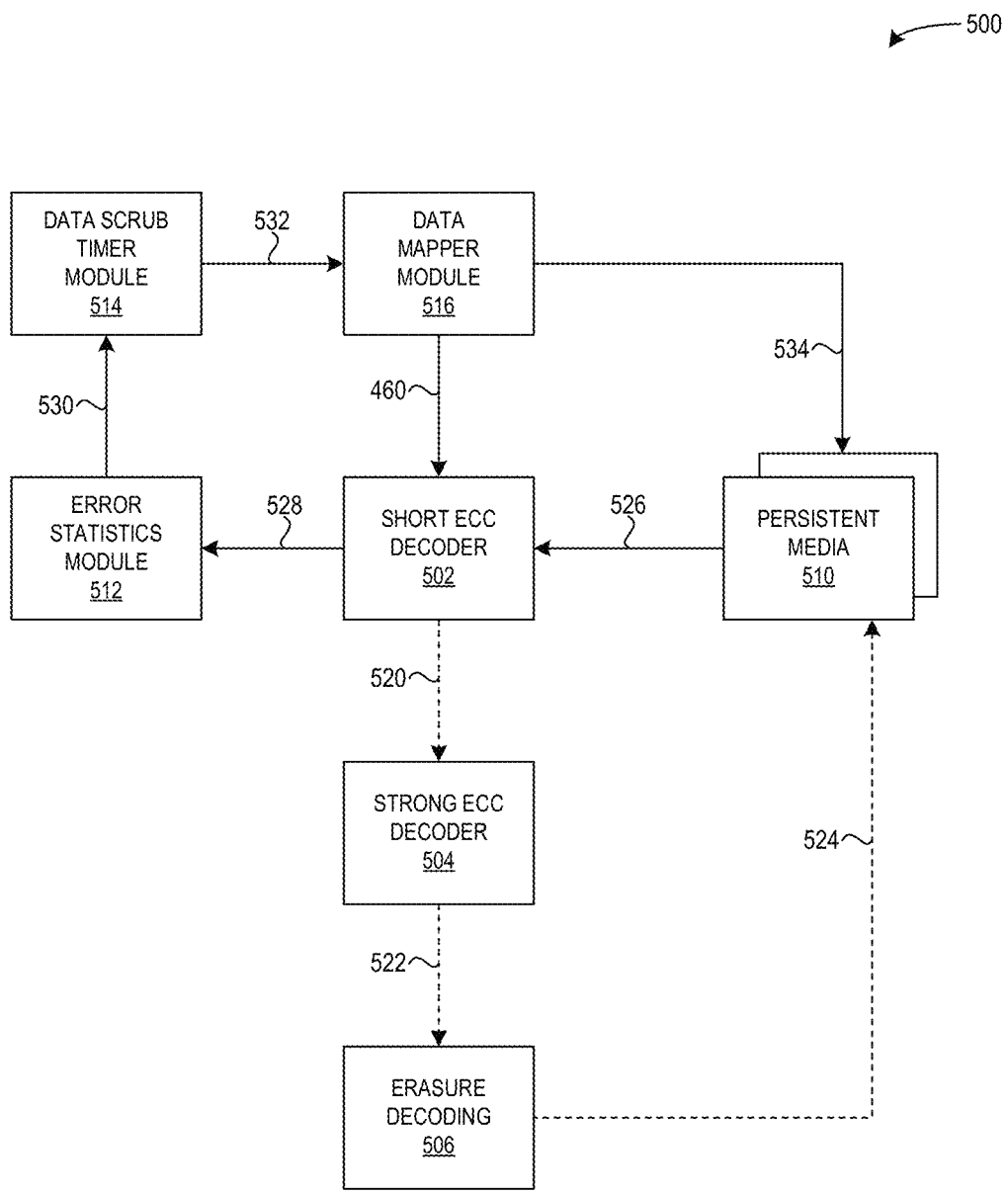
FIG. 5 illustrates an exemplary environment for facilitating data placement, including communications relating to scrubbing data, in accordance with an embodiment of the present application.

FIG. 5 illustrates an exemplary environment 500 for facilitating data placement, including communications relating to scrubbing data, in accordance with an embodiment of the present application. In environment 500, assume that data has been encoded in three levels as described above in relation to FIG. 3, and stored in persistent media 510. Environment 500 can include a short ECC decoder module 502, which can decode a short ECC-encoded codeword obtained from persistent media 510 (via a communication 526). If needed, short ECC decoder module 502 can send the short ECC-encoded codeword to a strong ECC decoder module 504 (via a communication 520) and to an erasure decoding module 506 (via a communication 522), which successfully decoded data can be sent back to persistent media 510 (via a communication 524).

Upon successfully decoding a short ECC-codeword or an EC-encoded group, short ECC decoder module 502 can send a message to an error statistics module 512 (via a communication 528). Error statistics module 512 can track and monitor an error count and an error pattern associated with decoding a single EC-encoded group or a plurality of EC-encoded groups. Error statistics module 512 can send information as needed (e.g., as configured by the system or a user) to a data scrub timer module 514 (via a communication 530). Data scrub timer module 514 can detect a condition to re-map data stored in an EC-encoded group. The condition to re-map the data can be based on, e.g.: a predetermined threshold for the error count or error pattern; a predetermined time period or interval; an access frequency of data stored in a given EC-encoded group; a garbage collection process; and a background operation associated with re-mapping data.

Data scrub timer module 514 can send a message to a data mapper module 516 (via a communication 532), which message indicates to data mapper module 516 to determine a new physical address in the persistent media (i.e., the non-volatile memory) at which to store the given EC-encoded group. Data mapper module 534 can store the given EC-encoded group to persistent media 510 (via a communication 534).

Exemplary Environment for Interleaving a Distribution of an EC-Encoded Group

Figure 6:
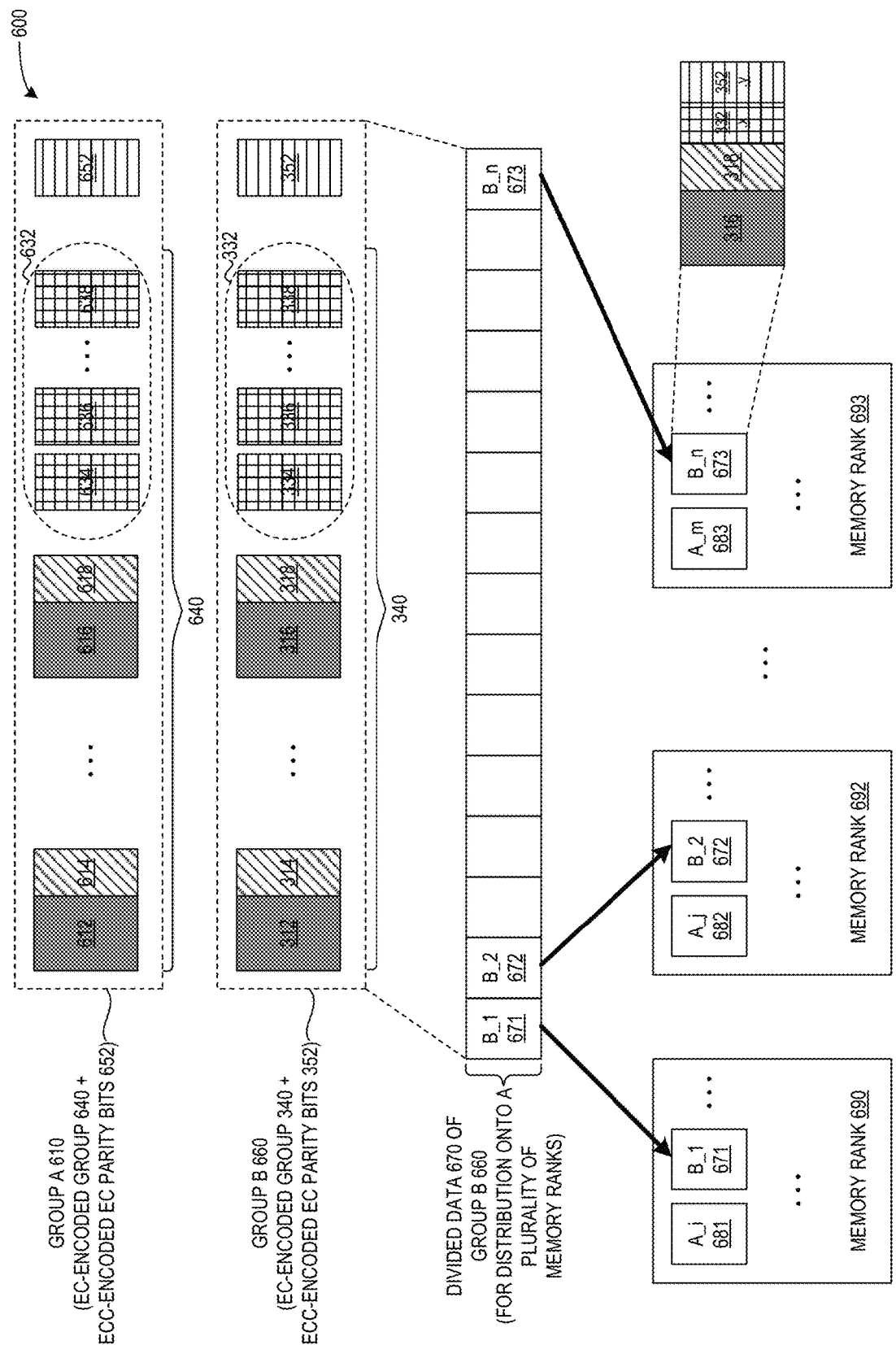
FIG. 6 illustrates an exemplary environment for facilitating data placement, including interleaving a distribution of an EC-encoded group onto a plurality of ranks of physical media of non-volatile memory, in accordance with an embodiment of the present application.

FIG. 6 illustrates an exemplary environment 600 for facilitating data placement, including interleaving a distribution of an EC-encoded group onto a plurality of ranks of physical media of non-volatile memory, in accordance with an embodiment of the present application. Environment 600 can include a group A 610, which includes an EC-encoded group 640 and ECC-encoded EC parity bits 652. EC-encoded group 640 can include: short ECC-encoded codewords, such as data 612 and corresponding short ECC parity bits 614, and data 616 and corresponding short ECC parity bits 618; and EC parity bits 632, such as EC parity bits 634, 636, and 638, which correspond to the group of short ECC-encoded codewords of EC-encoded group 640. Environment 600 can also include a group B 660, which includes an EC-encoded group 340 and ECC-encoded EC parity bits 352 (as described above in relation to FIG. 3).

During operation, the system can interleave a distribution of an EC-encoded group onto a plurality of ranks of memory arrays of the physical media. For example, the system can divide group B 660 into divided data 670 of group B 660 (for distribution onto a plurality of memory ranks). Divided data 670 can include B_1 671, B_2 672, and B_n 673. The system can place each divided data into a different memory rank. For example, the system can place B_1 671 onto a memory rank 690, which can also include divided data from group A 610, indicated by A_i 681. The system can place B_2 672 onto a memory rank 692, which can also include divided data from group A 610, indicated by A_j 682. The system can place B_n 673 onto a memory rank 693, which can also include divided data from group A 610, indicated by A_m 683.

Each divided data can include an original data chunk, its corresponding short ECC parity bits, a portion of the EC parity bits, and a portion of the ECC-encoded EC parity bits. For example, divided data B_n 673 can include: data 316; corresponding short ECC parity bits 318; a portion 332.$x$ of EC parity bits 332; and a portion 352.$y$ of ECC-encoded EC parity bits 352. The system can divide the data of a group (e.g., group A 610 or group B 660) based on an even, random, or other distribution of EC parity bits 332 and ECC-encoded EC parity bits 352.

By distributing each EC-encoded group onto multiple memory ranks, the system can provide a high level of parallelism, which can result in an increased throughput, and at the same time, can avoid data loss due to the failure of a single memory rank. Thus, the system can result in improving both data reliability and access throughput.

Exemplary Method for Mitigating Read Disturb Impact of Persistent Memory

Figure 7A:
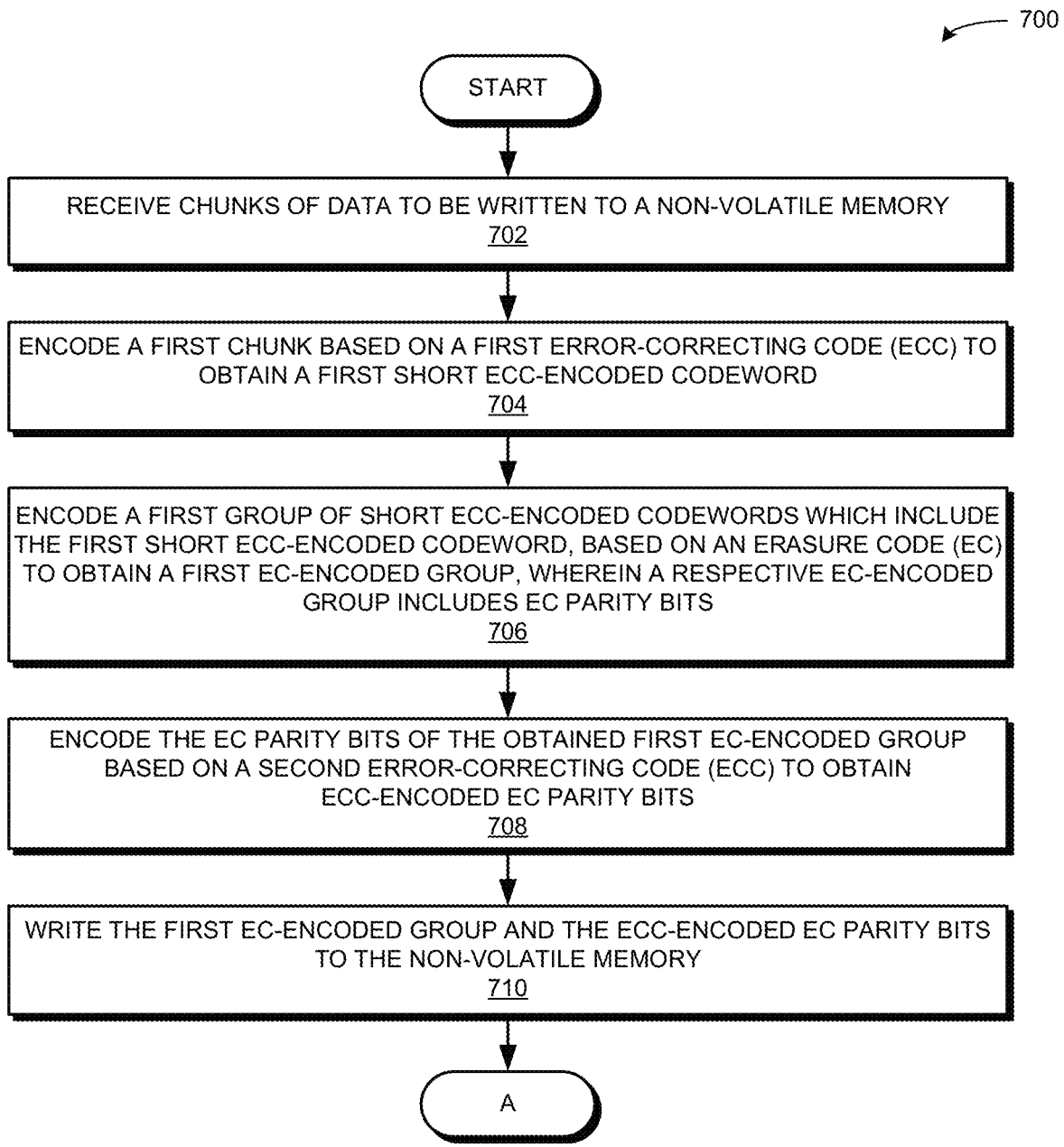
FIG. 7A presents a flowchart illustrating a method for facilitating data placement, including a short ECC-encoding, an EC-encoding, and a strong ECC-encoding, in accordance with an embodiment of the present application.

FIG. 7A presents a flowchart 700 illustrating a method for facilitating data placement, including a short ECC-encoding, an EC-encoding, and a strong ECC-encoding, in accordance with an embodiment of the present application. During operation, the system receives chunks of data to be written to a non-volatile memory (operation 702). The system encodes a first chunk based on a first error-correcting code (ECC) to obtain a first short ECC-encoded codeword (operation 704). The system encodes a first group of short ECC-encoded codewords (as described above in relation to group 322 of FIG. 3) which includes the first short ECC-encoded codeword, based on an erasure code (EC) to obtain a first EC-encoded group, wherein a respective EC-encoded group includes EC parity bits (operation 706). In some embodiments, the system EC encodes only the data of the short ECC-encoded codewords to obtain the first EC-encoded group (as described above in relation to group 324 of FIG. 3).

The system encodes the EC parity bits of the obtained first EC-encoded group based on a second error-correcting code (ECC) to obtain ECC-encoded EC parity bits (operation 708). The first error-correcting code provides a first uncorrectable bit error rate (e.g., $10^{-5}$ or $10^{-6}$), and the second error-correcting code provides a second uncorrectable bit error rate (e.g., $10^{17}$). The first rate can be a predetermined amount greater than the second rate. The system writes the first EC-encoded group and the ECC-encoded EC parity bits to the non-volatile memory (operation 710). The operation continues as described below at Label A of FIG. 7A.

Figure 7B:
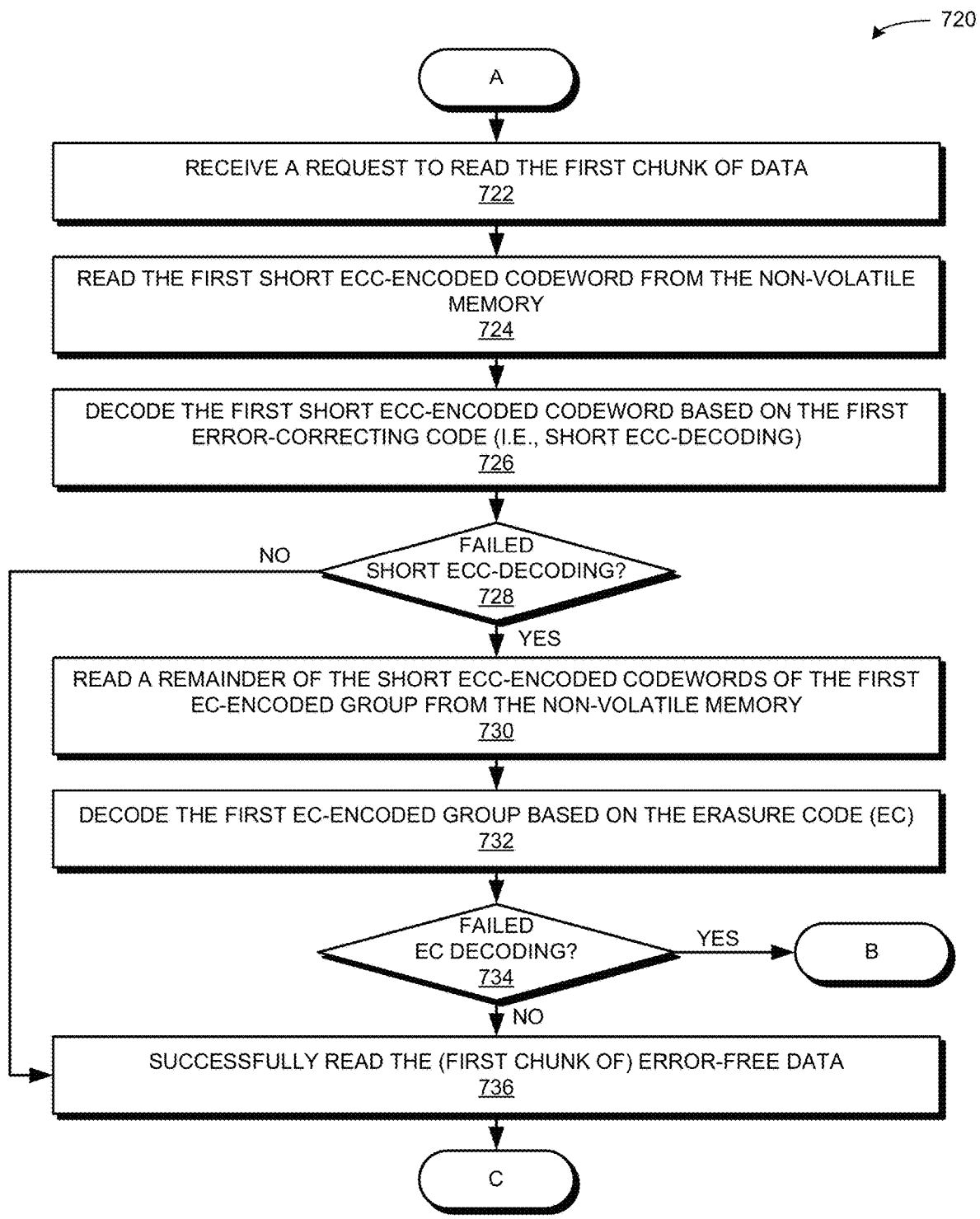
FIG. 7B presents a flowchart illustrating a method for facilitating data placement, including decoding data stored corresponding to FIG. 7A, in accordance with an embodiment of the present application.

FIG. 7B presents a flowchart 720 illustrating a method for facilitating data placement, including decoding data stored corresponding to FIG. 7A, in accordance with an embodiment of the present application. The system receives a request to read the first chunk of data (operation 722). The system reads the first short ECC-encoded codeword from the non-volatile memory (operation 724). The system decodes the first short ECC-encoded codeword based on the first error-correcting code (i.e., a short ECC-decoding) (operation 726). If the system does not determine a failed short ECC-decoding (i.e., determines a successful short ECC-decoding) (decision 728), the system successfully reads the error-free data (e.g., the first chunk), and the operation continues at Label C of FIG. 7D. If the system determines a failed short ECC-decoding (decision 728), the system reads a remainder of the short ECC-encoded codewords of the first EC-encoded group from the non-volatile memory (operation 730). The system decodes the first EC-encoded group based on the erasure code (EC) (operation 732).

Figure 7C:
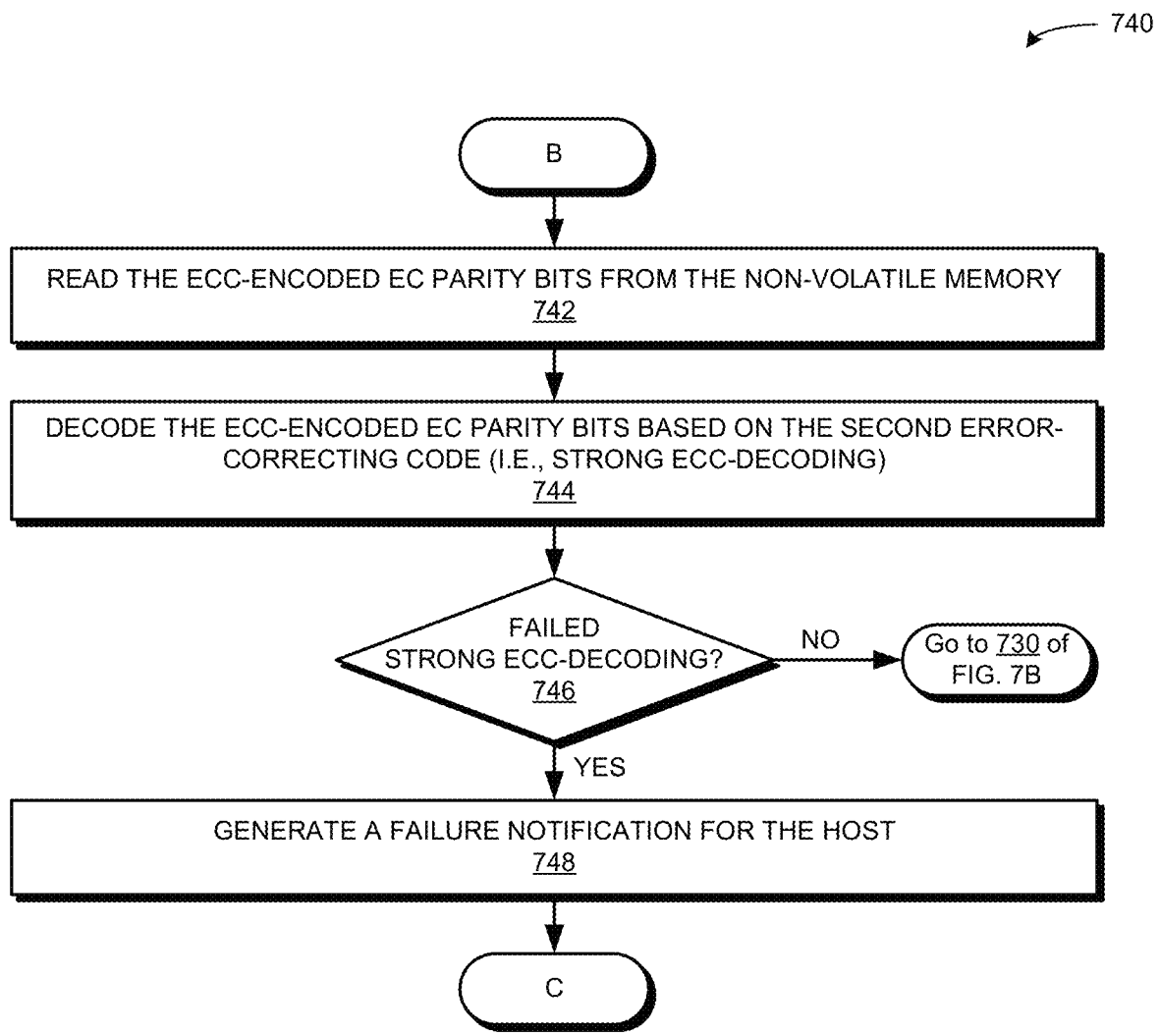
FIG. 7C presents a flowchart illustrating a method for facilitating data placement, including decoding data stored corresponding to FIG. 7A, in accordance with an embodiment of the present application.
Figure 7D:
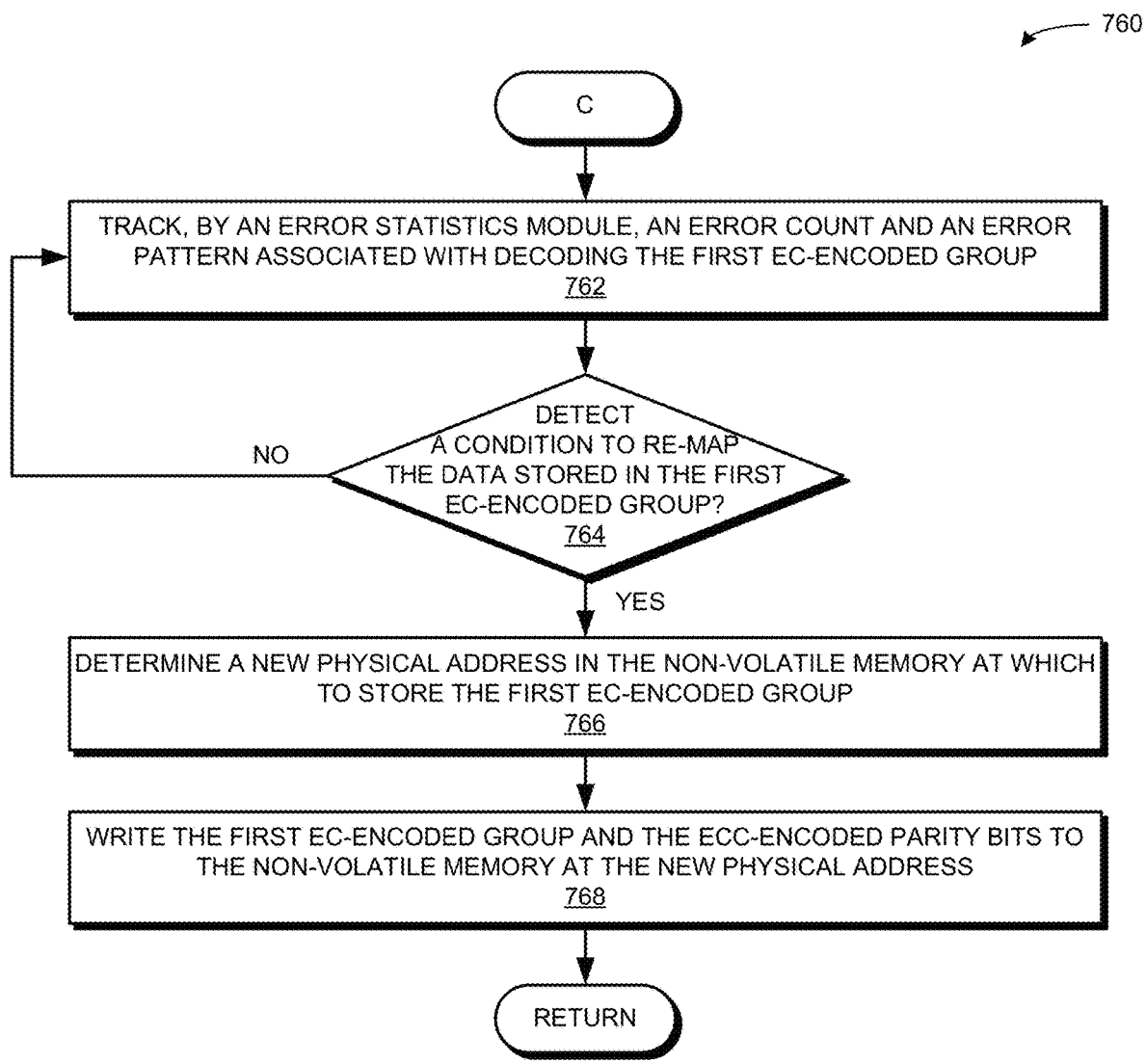
FIG. 7D presents a flowchart illustrating a method for facilitating data placement, including tracking error statistics for and re-mapping data stored corresponding to FIG. 7A, in accordance with an embodiment of the present application.

If the system does not determine a failed EC-decoding (i.e., determines a successful EC-decoding) (decision 734), the system successfully reads the error-free data (e.g., the first chunk), and the operation continues at Label C of FIG. 7D. If the system determines a failed EC-decoding (decision 734), the operation continues at Label B of FIG. 7C.

FIG. 7C presents a flowchart 740 illustrating a method for facilitating data placement, including decoding data stored corresponding to FIG. 7A, in accordance with an embodiment of the present application. During operation, the system reads the ECC-encoded EC parity bits from the non-volatile memory (operation 742). The system decodes the ECC-encoded EC parity bits based on the second error-correcting code (i.e., a strong ECC-decoding) (operation 744).

If the system does not determine a failed strong ECC-decoding (i.e., determines a successful strong ECC-decoding) (decision 746), the operation continues at operation 730 of FIG. 7B. If the system determines a failed strong ECC-decoding (decision 746), the system generates a failure notification for the host (operation 748). The system can report a memory failure and can request a hardware replacement, and can perform other administrative tasks related to the memory failure. The operation continues as described at Label C of FIG. 7D.

FIG. 7D presents a flowchart 760 illustrating a method for facilitating data placement, including tracking error statistics for and re-mapping data stored corresponding to FIG. 7A, in accordance with an embodiment of the present application. During operation, the system tracks, by an error statistics module, an error count and an error pattern associated with decoding the first EC-encoded group (operation 762). If the system does not detect a condition to re-map the data stored in the first EC-encoded group (decision 764), the operation continues at operation 762. If the system does detect a condition to re-map the data stored in the first EC-encoded group (decision 764), the system determines a new physical address in the non-volatile memory at which to store the first EC-encoded group (operation 766). The system writes the first EC-encoded group and the ECC-encoded parity bits to the non-volatile memory at the new physical address (operation 768), and the operation returns.

Exemplary Computer System and Apparatus

Figure 8:
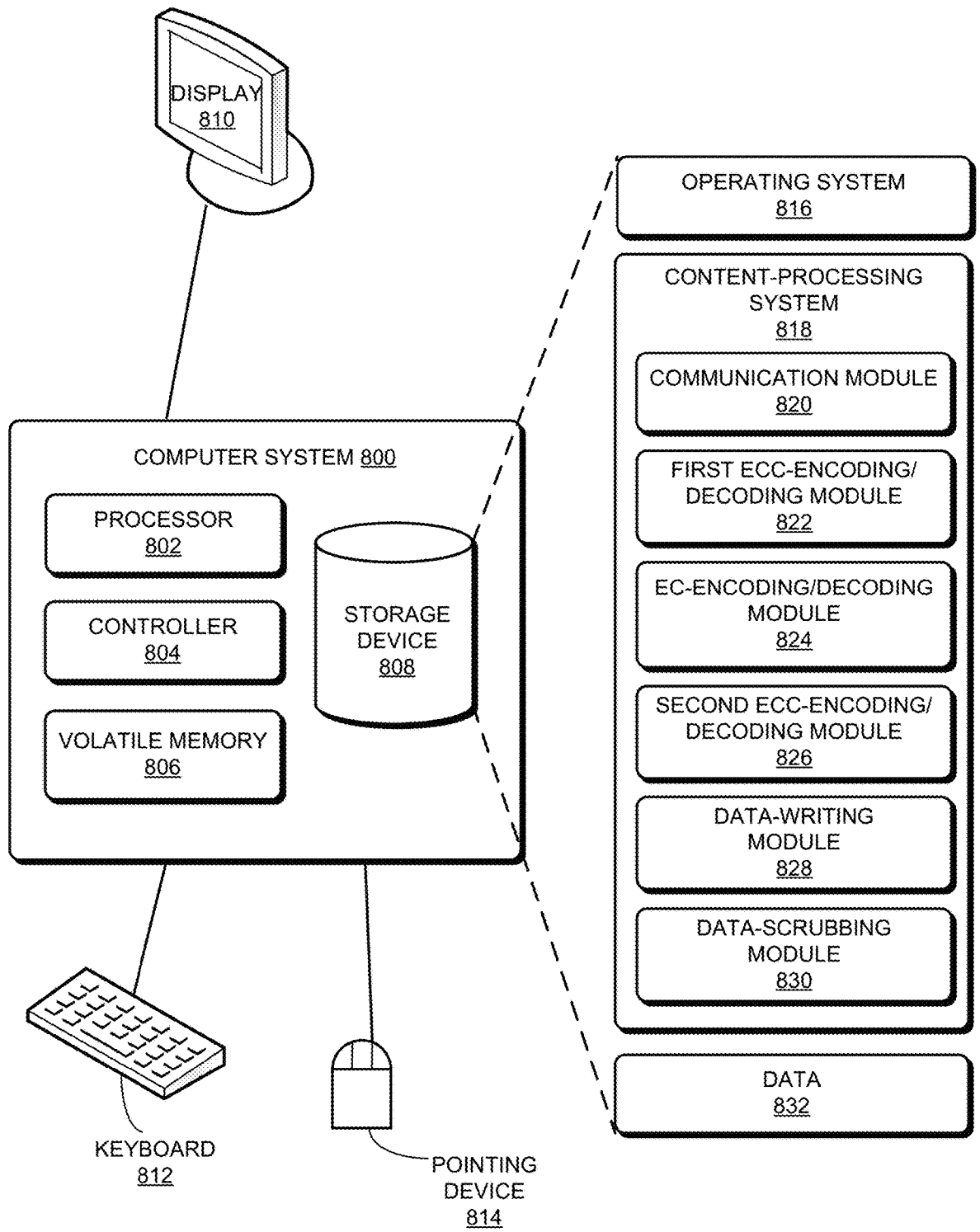
FIG. 8 illustrates an exemplary computer system that facilitates data placement, in accordance with an embodiment of the present application.

FIG. 8 illustrates an exemplary computer system that facilitates data placement, in accordance with an embodiment of the present application. Computer system 800 includes a processor 802, a controller 804, a volatile memory 806, and a storage device 808. Volatile memory 806 can include, e.g., random access memory (RAM), that serves as a managed memory, and can be used to store one or more memory pools. Storage device 808 can include persistent storage which can be managed or accessed via controller 804. Furthermore, computer system 800 can be coupled to a display device 810, a keyboard 812, and a pointing device 814. Storage device 808 can store an operating system 816, a content-processing system 818, and data 834.

Content-processing system 818 can include instructions, which when executed by computer system 800, can cause computer system 800 to perform methods and/or processes described in this disclosure. Specifically, content-processing system 818 can include instructions for receiving and transmitting data packets, including data to be encoded, decoded, read, or written/stored, a data value, a physical address, a logical address, a codeword, and parity bits (communication module 820).

Content-processing system 818 can further include instructions for receiving chunks of data to be written to a non-volatile memory (communication module 820). Content-processing system 818 can include instructions for encoding a first chunk based on a first error-correcting code (ECC) to obtain a first ECC-encoded codeword (first ECC-encoding/decoding module). Content-processing system 818 can include instructions for encoding a first group of ECC-encoded codewords which include the first ECC-encoded codeword, based on an erasure code (EC) to obtain a first EC-encoded group, wherein a respective EC-encoded group includes EC parity bits (EC-encoding/decoding module 824). Content-processing system 818 can also include instructions for encoding the EC parity bits of the obtained first EC-encoded group based on a second error-correcting code (ECC) to obtain ECC-encoded EC parity bits (second ECC-encoding/decoding module 826). Content-processing system 818 can include instructions for writing the first EC-encoded group and the ECC-encoded EC parity bits to the non-volatile memory (data-writing module 828).

Content-processing system 818 can additionally include instructions for receiving a request to read the first chunk of data (communication module 820). Content-processing system 818 can include instructions for reading the first short ECC-encoded codeword from the non-volatile memory (communication module 820). Content-processing system 818 can include instructions for decoding the first short ECC-encoded codeword based on the first error-correcting code (first ECC-encoding/decoding module 822). Content-processing system 818 can include instructions for, in response to unsuccessfully decoding the first short ECC-encoded codeword based on the first error-correcting code, decoding the first EC-encoded group based on the erasure code (EC-encoding/decoding module 824). Content-processing system 818 can also include instructions for, in response to unsuccessfully decoding the first EC-encoded group based on the erasure code, decoding the ECC-encoded EC parity bits based on the second error-correcting code (second ECC-encoding/decoding module 826). Content-processing system 818 can include instructions for, in response to unsuccessfully decoding the ECC-encoded EC parity bits based on the second error-correcting code, generating a failure notification for the host (communication module 820).

Content-processing system 818 can further include instructions for distributing the first EC-encoded group and the ECC-encoded EC parity bits for placement onto a plurality of ranks of physical media of the non-volatile memory (data-writing module 828).

Content-processing system 818 can additionally include instructions for tracking, by an error statistics module, an error count and an error pattern associated with decoding the first EC-encoded group (data-scrubbing module 830). Content-processing system 818 can include instructions for, in response to detecting a condition to re-map the data stored in the first EC-encoded group, determining a new physical address in the non-volatile memory at which to store the first EC-encoded group (data-scrubbing module 830). Content-processing system 818 can include instructions for writing the first EC-encoded group and the ECC-encoded EC parity bits to the non-volatile memory at the new physical address (data-writing module 828).

Data 832 can include any data that is required as input or that is generated as output by the methods and/or processes described in this disclosure. Specifically, data 832 can store at least: data; a chunk of data; encoded data; ECC-encoded/decoded data; EC-encoded/decoded data; a short ECC-encoded codeword; a group of short ECC-encoded codewords; a short ECC-encoded codeword which includes data and corresponding short ECC parity bits; EC parity bits; ECC-encoded EC parity bits; an error correcting code; a predetermined amount; an error rate associated with an error correcting code; a message; a failure notification; a distribution or division of a group of data, an EC-encoded group, EC parity bits, and/or ECC-encoded EC parity bits; an indicator of a memory rank of physical media; an error count; an error pattern; a condition to re-map data; a physical address; a new physical address; a predetermined threshold for the error count or the error pattern; a predetermined time period or interval; an access frequency of the data stored in the first EC-encoded group; a garbage collection process; and a background operation associated with re-mapping data.

Figure 9:
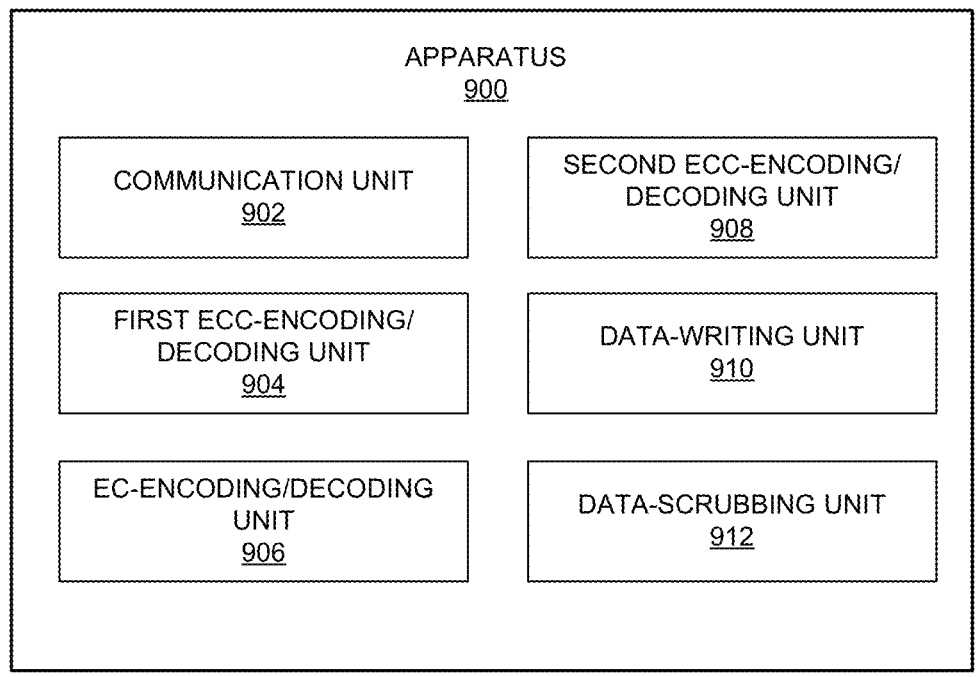
FIG. 9 illustrates an exemplary apparatus that facilitates data placement, in accordance with an embodiment of the present application.

FIG. 9 illustrates an exemplary apparatus 900 that facilitates data placement, in accordance with an embodiment of the present application. Apparatus 900 can comprise a plurality of units or apparatuses which may communicate with one another via a wired, wireless, quantum light, or electrical communication channel. Apparatus 900 may be realized using one or more integrated circuits, and may include fewer or more units or apparatuses than those shown in FIG. 9. Further, apparatus 900 may be integrated in a computer system, or realized as a separate device which is capable of communicating with other computer systems and/or devices. Specifically, apparatus 900 can comprise units 902-912 which perform functions or operations similar to modules 820-830 of computer system 800 of FIG. 8, including: a communication unit 902; a first ECC-encoding/decoding unit 904; an EC-encoding/decoding unit 906; a second ECC-encoding/decoding unit 908; a data-writing unit 910; and a data-scrubbing unit 912.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating data placement, the method comprising:
   receiving chunks of data to be written to a non-volatile memory;
   encoding a first chunk based on a first error-correcting code (ECC) to obtain a first ECC-encoded codeword;
   encoding a first group of ECC-encoded codewords which include the first ECC-encoded codeword, based on an erasure code (EC) to obtain a first EC-encoded group, wherein a respective EC-encoded group includes EC parity bits; and
   writing the first EC-encoded group to the non-volatile memory.

2. The method of claim 1, further comprising:
   encoding the EC parity bits of the obtained first EC-encoded group based on a second error-correcting code (ECC) to obtain ECC-encoded parity bits,
   wherein writing the first EC-encoded group to the non-volatile memory further comprises writing the ECC-encoded EC parity bits to the non-volatile memory,
   wherein the first error-correcting code provides a first uncorrectable bit error rate, wherein the second error-correcting code provides a second uncorrectable bit error rate, and wherein the first rate is a predetermined amount greater than the second rate.

3. The method of claim 2,
   wherein the ECC-encoded codewords of the first group are encoded based on the first error-correcting code, wherein the first ECC-encoded codeword includes short ECC parity bits, wherein the ECC-encoded EC parity bits comprise strong ECC parity bits, and wherein a first error rate associated with the encoding to obtain the short ECC parity bits is greater than a second error rate associated with the encoding to obtain the ECC-encoded EC parity bits.

4. The method of claim 2, wherein in response to receiving a request to read the first chunk of data, the method further comprises:
   reading the first ECC-encoded codeword from the non-volatile memory;
   decoding the first ECC-encoded codeword based on the first error-correcting code;
   in response to unsuccessfully decoding the first ECC-encoded codeword based on the first error-correcting code, decoding the first EC-encoded group based on the erasure code;
   in response to unsuccessfully decoding the first EC-encoded group based on the erasure code, decoding the ECC-encoded EC parity bits based on the second error-correcting code; and
   in response to unsuccessfully decoding the ECC-encoded EC parity bits based on the second error-correcting code, generating a failure notification for the host.

5. The method of claim 4, further comprising:
   in response to successfully decoding the first ECC-encoded codeword based on the first error-correcting code, successfully reading the first chunk of data;
   in response to successfully decoding the first EC-encoded group based on the erasure code, successfully reading the first chunk of data; and
   in response to successfully decoding the ECC-encoded EC parity bits based on the second error-correcting code, decoding the first EC-encoded group based on the erasure code.

6. The method of claim 2, wherein writing the first EC-encoded group and the ECC-encoded EC parity bits to the non-volatile memory further comprises:
   distributing the first EC-encoded group and the ECC-encoded EC parity bits for placement onto a plurality of ranks of physical media of the non-volatile memory.

7. The method of claim 2, further comprising:
   tracking, by an error statistics module, an error count and an error pattern associated with decoding the first EC-encoded group;
   in response to detecting a condition to re-map the data stored in the first EC-encoded group, determining a new physical address in the non-volatile memory at which to store the first EC-encoded group; and
   writing the first EC-encoded group and the ECC-encoded EC parity bits to the non-volatile memory at the new physical address.

8. The method of claim 7, wherein the condition to re-map the data is based on one or more of:
   a predetermined threshold for the error count or the error pattern;
   a predetermined time period or interval;
   an access frequency of the data stored in the first EC-encoded group;
   a garbage collection process; and
   a background operation associated with re-mapping data.

9. The method of claim 2, wherein the non-volatile memory is coupled to a central processing unit and includes:
   an interface for communicating with the central processing unit;
   a non-volatile memory controller which performs encoding based on the first error-correcting code, the erasure code, and the second error-correcting code; and
   physical media associated with a plurality of ranks of the non-volatile memory to which data is to be written for persistent storage.

10. A computer system for facilitating data placement, the system comprising:
    a processor; and
    a memory coupled to the processor and storing instructions, which when executed by the processor cause the processor to execute the instructions in a plurality of steps, the steps comprising:
    receiving chunks of data to be written to a non-volatile memory;
    encoding a first chunk based on a first error-correcting code (ECC) to obtain a first ECC-encoded codeword;
    encoding a first group of ECC-encoded codewords which include the first ECC-encoded codeword, based on an erasure code (EC) to obtain a first EC-encoded group, wherein a respective EC-encoded group includes EC parity bits; and
    writing the first EC-encoded group to the non-volatile memory.

11. The computer system of claim 10, wherein the steps further comprise:
    encoding the EC parity bits of the obtained first EC-encoded group based on a second error-correcting code (ECC) to obtain ECC-encoded parity bits,
    wherein writing the first EC-encoded group to the non-volatile memory further comprises writing the ECC-encoded EC parity bits to the non-volatile memory,
    wherein the first error-correcting code provides a first uncorrectable bit error rate, wherein the second error-correcting code provides a second uncorrectable bit error rate, and wherein the first rate is a predetermined amount greater than the second rate.

12. The computer system of claim 11,
wherein the ECC-encoded codewords of the first group are encoded based on the first error-correcting code, wherein the first ECC-encoded codeword includes short ECC parity bits, wherein the ECC-encoded EC parity bits comprise strong ECC parity bits, and wherein a first error rate associated with the encoding to obtain the short ECC parity bits is greater than a second error rate associated with the encoding to obtain the ECC-encoded EC parity bits.

13. The computer system of claim 11, wherein in response to receiving a request to read the first chunk of data, the steps further comprise:
reading the first ECC-encoded codeword from the non-volatile memory;
decoding the first ECC-encoded codeword based on the first error-correcting code;
in response to unsuccessfully decoding the first ECC-encoded codeword based on the first error-correcting code, decoding the first EC-encoded group based on the erasure code;
in response to unsuccessfully decoding the first EC-encoded group based on the erasure code, decoding the ECC-encoded EC parity bits based on the second error-correcting code; and
in response to unsuccessfully decoding the ECC-encoded EC parity bits based on the second error-correcting code, generating a failure notification for the host.

14. The computer system of claim 13, wherein the steps further comprise:
in response to successfully decoding the first ECC-encoded codeword based on the first error-correcting code, successfully reading the first chunk of data;
in response to successfully decoding the first EC-encoded group based on the erasure code, successfully reading the first chunk of data; and
in response to successfully decoding the ECC-encoded EC parity bits based on the second error-correcting code, decoding the first EC-encoded group based on the erasure code.

15. The computer system of claim 11, wherein writing the first EC-encoded group and the ECC-encoded EC parity bits to the non-volatile memory further comprises:
distributing the first EC-encoded group and the ECC-encoded EC parity bits for placement onto a plurality of ranks of physical media of the non-volatile memory.

16. The computer system of claim 11, wherein the steps further comprise:
tracking, by an error statistics module, an error count and an error pattern associated with decoding the first EC-encoded group;
in response to detecting a condition to re-map the data stored in the first EC-encoded group, determining a new physical address in the non-volatile memory at which to store the first EC-encoded group; and
writing the first EC-encoded group and the ECC-encoded EC parity bits to the non-volatile memory at the new physical address.

17. The computer system of claim 16, wherein the condition to re-map the data is based on one or more of:
a predetermined threshold for the error count or the error pattern;
a predetermined time period or interval;
an access frequency of the data stored in the first EC-encoded group;
a garbage collection process; and
a background operation associated with re-mapping data.

18. The computer system of claim 11, wherein the non-volatile memory is coupled to a central processing unit and includes:
an interface for communicating with the central processing unit;
a non-volatile memory controller which performs encoding based on the first error-correcting code, the erasure code, and the second error-correcting code; and
physical media associated with a plurality of ranks of the non-volatile memory to which data is to be written for persistent storage.

19. A non-transitory computer-readable storage medium storing instructions that when executed by a computer cause the computer to execute the instructions in a plurality of steps, the steps comprising:
receiving chunks of data to be written to a non-volatile memory;
encoding a first chunk based on a first error-correcting code (ECC) to obtain a first ECC-encoded codeword;
encoding a first group of ECC-encoded codewords which include the first ECC-encoded codeword, based on an erasure code (EC) to obtain a first EC-encoded group, wherein a respective EC-encoded group includes EC parity bits; and
writing the first EC-encoded group to the non-volatile memory.

20. The storage medium of claim 19, wherein in response to receiving a request to read the first chunk of data, the steps further comprise:
reading the first ECC-encoded codeword from the non-volatile memory;
decoding the first ECC-encoded codeword based on the first error-correcting code;
in response to unsuccessfully decoding the first ECC-encoded codeword based on the first error-correcting code, decoding the first EC-encoded group based on the erasure code;
in response to unsuccessfully decoding the first EC-encoded group based on the erasure code, decoding the ECC-encoded EC parity bits based on the second error-correcting code; and
in response to unsuccessfully decoding the ECC-encoded EC parity bits based on the second error-correcting code, generating a failure notification for the host.

* * * * *